(12) United States Patent
Nakagawa

(10) Patent No.: US 9,645,458 B2
(45) Date of Patent: May 9, 2017

(54) ELECTROOPTICAL DEVICE, METHOD OF MANUFACTURING ELECTROOPTICAL DEVICE, AND ELECTRONIC APPARATUS

(71) Applicant: Seiko Epson Corporation, Tokyo (JP)

(72) Inventor: Masashi Nakagawa, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/762,736

(22) PCT Filed: Jan. 10, 2014

(86) PCT No.: PCT/JP2014/000095
§ 371 (c)(1),
(2) Date: Jul. 22, 2015

(87) PCT Pub. No.: WO2014/115499
PCT Pub. Date: Jul. 31, 2014

(65) Prior Publication Data
US 2015/0362805 A1    Dec. 17, 2015

(30) Foreign Application Priority Data
Jan. 22, 2013    (JP) .................................. 2013-009014

(51) Int. Cl.
*G02F 1/00*    (2006.01)
*G02F 1/1362*    (2006.01)
(Continued)

(52) U.S. Cl.
CPC ...... *G02F 1/136204* (2013.01); *G02F 1/1368* (2013.01); *G02F 1/136213* (2013.01);
(Continued)

(58) Field of Classification Search
CPC .................................. G02F 1/1368; G09F 9/30
See application file for complete search history.

(56) References Cited

U.S. PATENT DOCUMENTS 6,646,693 B2    11/2003    Zhang et al.
7,226,836 B2    6/2007    Moriwaki
(Continued)

FOREIGN PATENT DOCUMENTS

JP    02-256030 A    10/1990
JP    10-325963 A    12/1998
(Continued)

OTHER PUBLICATIONS

English translation of the application in PCT/JP2014/000095, downloaded Dec. 16, 2016.*
(Continued)

*Primary Examiner* — Thomas L Dickey
(74) *Attorney, Agent, or Firm* — ALG Intellectual Property, LLC

(57) ABSTRACT

The liquid crystal device includes a first base material 10a, a TFT 30 that is disposed on the first base material 10a, a capacitive element 16 which is connected to the TFT 30 and in which an insulating film is interposed between a pair of electrodes, a first interconnection 16a1 that is electrically connected to one electrode of the pair of electrodes, a second interconnection 16c1 that is electrically connected to the other electrode of the pair of electrodes, a contact hole CNT71 that electrically connects the first interconnection 16a1 and a pixel electrode 27, and a contact hole CNT72 that is disposed on the second interconnection 16c1. The contact holes CNT71 and CNT72 are provided in a pixel insulating layer 11e that is disposed between the pixel electrode 27 and the first interconnection 16a1 and the second interconnection 16c1.

13 Claims, 10 Drawing Sheets

(51) Int. Cl.
*G02F 1/1368* (2006.01)
*H01L 27/12* (2006.01)
*G02F 1/1333* (2006.01)

(52) U.S. Cl.
CPC ...... *G02F 1/136227* (2013.01); *H01L 27/124* (2013.01); *H01L 27/1255* (2013.01); *H01L 27/1259* (2013.01); *G02F 1/133345* (2013.01)

(56) References Cited

U.S. PATENT DOCUMENTS

| | | | |
|---|---|---|---|
| 7,781,815 B2 | 8/2010 | Moriwaki | |
| 2004/0070718 A1* | 4/2004 | Saigo | G02F 1/136227 349/141 |
| 2012/0113333 A1* | 5/2012 | Oba | G02F 1/1345 349/5 |

FOREIGN PATENT DOCUMENTS

| | | |
|---|---|---|
| JP | 2004-109248 A | 4/2004 |
| JP | 2005-128309 A | 5/2005 |
| JP | 2007-122071 A | 5/2007 |
| JP | 2007-123297 A | 5/2007 |
| JP | 2012-098577 A | 5/2012 |
| WO | WO-2007-029394 A | 3/2007 |

OTHER PUBLICATIONS

Written opinion in PCT/JP2014/000095, downloaded Dec. 16, 2016.*

Search Report and Written Opinion received in International Application No. PCT/JP2014/000095; Mar. 25, 2014.

* cited by examiner (a)

(b)

(c)

ELECTROOPTICAL DEVICE, METHOD OF MANUFACTURING ELECTROOPTICAL DEVICE, AND ELECTRONIC APPARATUS

TECHNICAL FIELD

The present invention relates to an electrooptical device, a method of manufacturing an electrooptical device, and an electronic apparatus.

BACKGROUND ART

As an example of the electrooptical device, there is known an active drive type liquid crystal device provided with a transistor as an element, which performs switching control of a pixel electrode, for each pixel. For example, the liquid crystal device is used in a direct-viewing type display, a light valve of a projector, and the like.

For example, as disclosed in PTL 1, in the liquid crystal device, a pixel electrode and a capacitor electrode having a structure in which a dielectric film (insulating film) is interposed between a pair of electrodes are electrically connected through a contact hole.

CITATION LIST

Patent Literature

PTL 1: Japanese Unexamined Patent Application Publication No. 2005-128309

SUMMARY OF INVENTION

Technical Problem

However, in a case where the area of an interconnection (on a COM potential side) which is connected to one electrode of the pair of electrodes is larger than the area of an interconnection (on a pixel electrode side) which is connected to the other electrode, static electricity that occurs during the manufacturing process is collected in the one electrode in a relatively large amount (the one electrode has a large parasitic capacitance). Accordingly, when a contact hole for connection with the pixel electrode is opened on the interconnection, excessive static electricity flows from the one electrode to the other electrode, and thus there is a problem in that the dielectric film (insulating film) that constitutes a capacitor is electrostatically broken down.

Solution to Problem

The invention has been made to solve at least a part of the above-described problem, and can be realized as the following aspects or application examples.

APPLICATION EXAMPLE 1

According to this application example, there is provided an electrooptical device including a first base material, a transistor that is disposed on the first base material, a capacitor which is connected to the transistor and in which an insulating film is interposed between a pair of electrodes, a first interconnection that is electrically connected to one electrode of the pair of electrodes, a second interconnection that is electrically connected to the other electrode of the pair of electrodes, a first contact hole that electrically connects the first interconnection and a pixel electrode, a second contact hole that is disposed on the second interconnection, and an external connection terminal configured to supply a potential to the second interconnection. The first contact hole and the second contact hole are provided in a pixel insulating film that is disposed between the pixel electrode, and the first interconnection and the second interconnection.

According to this application example, since the first contact hole that is electrically connected to one electrode, and the second contact hole that is electrically connected to the other electrode are formed to be open in the pixel insulating film of the same layer, static electricity that is collected on a first interconnection side can be released from the first contact hole, and static electricity that is collected on a second interconnection side can be released from the second contact hole. In other words, the second contact hole is provided independently from the first contact hole for electrical connection with the pixel electrode. Accordingly, for example, it is possible to prevent excessive static electricity accumulated on a second interconnection side, in which an area of an interconnection is wide, from flowing to the first contact hole in a concentrated manner. That is, it is possible to prevent a capacitor from being broken due to the excessive static electricity. In addition, the interconnection that is electrically connected to one electrode or the other electrode of the pair of electrodes is intended to include an interconnection according to an electrode layer of the one electrode or the other electrode of the pair of electrodes.

APPLICATION EXAMPLE 2

In the electrooptical device according to the application example, it is preferable that a height from an upper surface of the first base material to an upper surface of the second interconnection is higher than a height from the upper surface of the first base material to an upper surface of the first interconnection.

According to this application example, since the height of the upper surface of the second interconnection is higher than the upper surface of the first interconnection, it is possible to allow the second contact hole, which is connected to the second interconnection, to be opened prior to the first contact hole that is connected to the first interconnection in accordance with the height relationship. Accordingly, even in a case where excessive static electricity is accumulated on a second interconnection side (even in a case of having a large parasitic capacitance), it is possible to release the static electricity from the second contact hole without doing so through a capacitor. Accordingly, it is possible to prevent the capacitor from being broken.

APPLICATION EXAMPLE 3

In the electrooptical device according to the application example, it is preferable that a common potential is applied to the second interconnection.

According to this application example, since the common potential is applied to the second interconnection, the area on a second interconnection side is wider than the area on a first interconnection side. Accordingly, even in a case where excessive static electricity is accumulated on the second interconnection side, it is possible to release the static electricity from the second contact hole, and thus it is possible to prevent a capacitor from being broken.

APPLICATION EXAMPLE 4

The electrooptical device according to the application example may further include a second base material that faces the first base material, and it is preferable that the second contact hole is provided at a position that overlaps the second base material when viewed in a direction from the second base material to the first base material.

According to this application example, since the second contact hole is provided at a position that overlaps the second base material when viewed in a direction from the second base material to the first base material, it is possible to efficiently release the static electricity at a position that is close to a display area, and as a result, it is possible to prevent the dielectric film from being broken. According to this, it is preferable that a plurality of the second contact holes are provided at the periphery of the display area.

APPLICATION EXAMPLE 5

According to this application example, there is provided a method of manufacturing an electrooptical device. The method includes a transistor forming process of forming a transistor on a first base material, a capacitor forming process of forming a capacitor, which is connected to the transistor and has a structure in which an insulating film is interposed between a pair of electrodes, on the transistor, a first interconnection forming process of forming a first interconnection that is electrically connected to one electrode of the pair of electrodes, a second interconnection forming process of forming a second interconnection that is electrically connected to the other electrode of the pair of electrodes, a pixel insulating film forming process of forming a pixel insulating film on the first interconnection and the second interconnection, a contact hole forming process of forming a first contact hole that electrically connects the first interconnection and a pixel electrode, and a second contact hole that is electrically connected to the second interconnection on the pixel insulating film, and an external connection terminal forming process of forming an external connection terminal configured to supply a potential to the second interconnection.

According to this application example, since the first contact hole that is electrically connected to one electrode, and the second contact hole that is electrically connected to the other electrode are formed in the pixel insulating film of the same layer, static electricity that is collected on a first interconnection side can be released from the first contact hole, and static electricity that is collected on a second interconnection side can be released from the second contact hole. In other words, the second contact hole is provided independently from the first contact hole for electrical connection with the pixel electrode. Accordingly, for example, it is possible to prevent excessive static electricity accumulated on a second interconnection side, in which an area of an interconnection is wide, from flowing to the first contact hole in a concentrated manner. That is, it is possible to prevent a capacitor from being broken due to the excessive static electricity.

APPLICATION EXAMPLE 6

In the method of manufacturing an electrooptical device according to the application example, it is preferable that in the second interconnection forming process, the second interconnection is formed in such a manner that a height of an upper surface of the second interconnection is higher than a height of an upper surface of the first interconnection.

According to this application example, since the height of the upper surface of the second interconnection is higher than the upper surface of the first interconnection, it is possible to allow the second contact hole to be opened prior to the first contact hole in accordance with the height relationship. Accordingly, even in a case where excessive static electricity is accumulated on a second interconnection side, it is possible to release the static electricity from the second contact hole without doing so through a capacitor. Accordingly, it is possible to prevent the capacitor from being broken.

APPLICATION EXAMPLE 7

The method of manufacturing an electrooptical device according to the application example may further include a second base material disposing process of disposing a second base material to face the first base material, and it is preferable that the second contact hole is provided at a position that overlaps the second base material when viewed in a direction from the second base material to the first base material.

According to this application example, since the second contact hole is provided at a position that overlaps the second base material when viewed in a direction from the second base material to the first base material, it is possible to efficiently release the static electricity at a position that is close to the display area, and as a result, it is possible to prevent the dielectric film from being broken.

APPLICATION EXAMPLE 8

According to this application example, there is provided an electronic apparatus including the electrooptical device that is described above.

According to this application example, it is possible to protect a capacitor from excessive static electricity, and thus it is possible to provide an electronic apparatus with high reliability.

DESCRIPTION OF EMBODIMENTS

Figure 1:
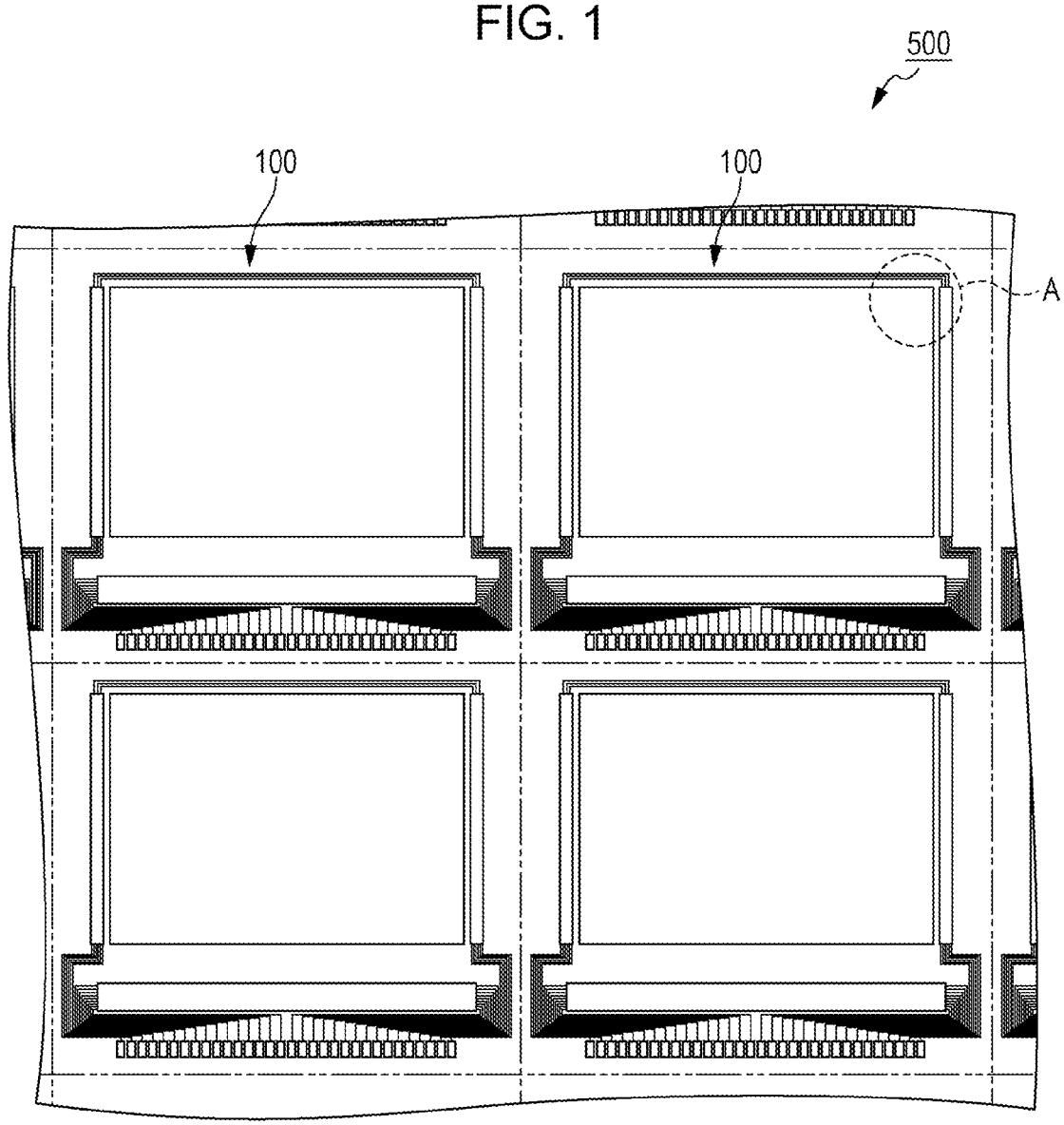
FIG. 1 is a schematic plan view illustrating a configuration of a part of a wafer in which a plurality of liquid crystal devices as electrooptical devices are attached to the surface thereof.

Hereinafter, an embodiment for implementation of the invention will be described with reference to the accompanying drawings. However, in the drawings, portions that are described are appropriately enlarged or reduced in order to be recognizable.

In addition, in the following embodiment, for example, description of "on a substrate" is intended to illustrate a case of being disposed on a substrate so as to come into contact therewith, a case of being disposed on the substrate through another constituent element, or a case where a part is disposed on the substrate to come into contact therewith and a part is disposed on the substrate through another constituent element, and the like.

In this embodiment, description will be given of an active matrix type liquid crystal device provided with a thin film transistor (TFT), which is an electrooptical device, as a switching element of a pixel as an example. For example, the liquid crystal device can be appropriately used as a light modulating element (liquid crystal light valve) of a projection type display apparatus (liquid crystal projector).

<Configuration of Electrooptical Device>

Figure 2:
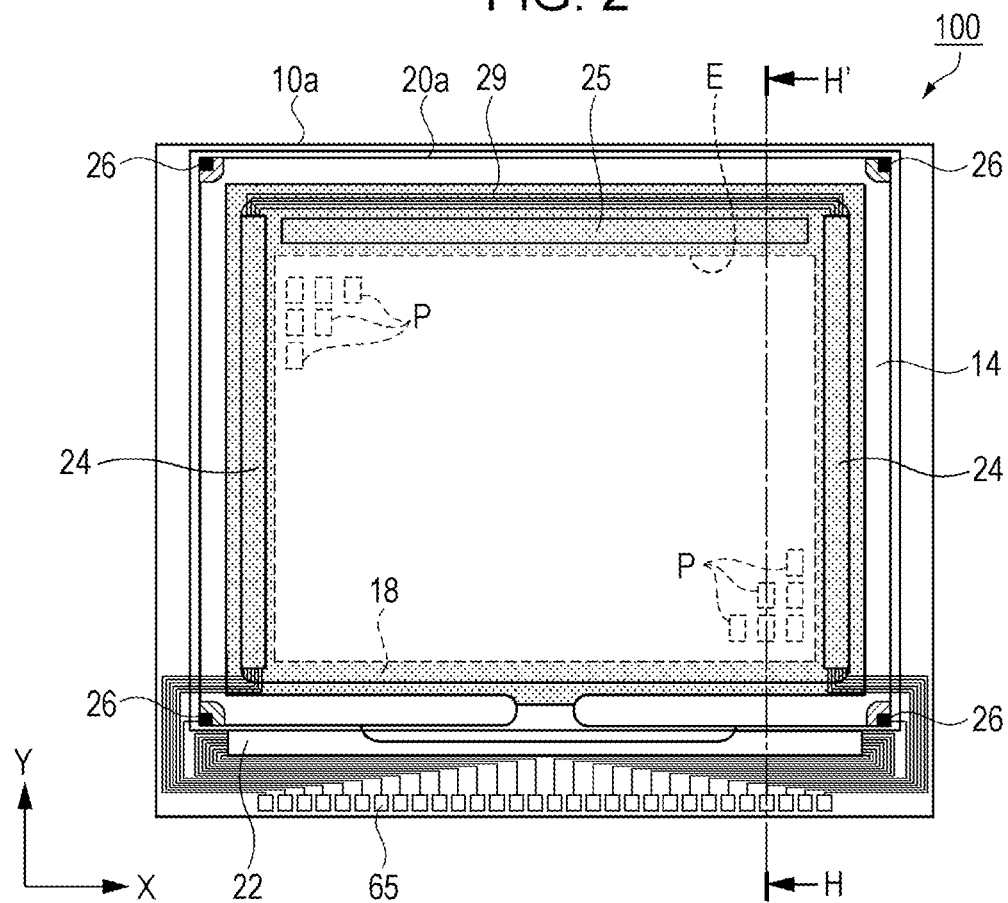
FIG. 2 is a schematic plan view illustrating a configuration of each of the liquid crystal devices.
Figure 3:
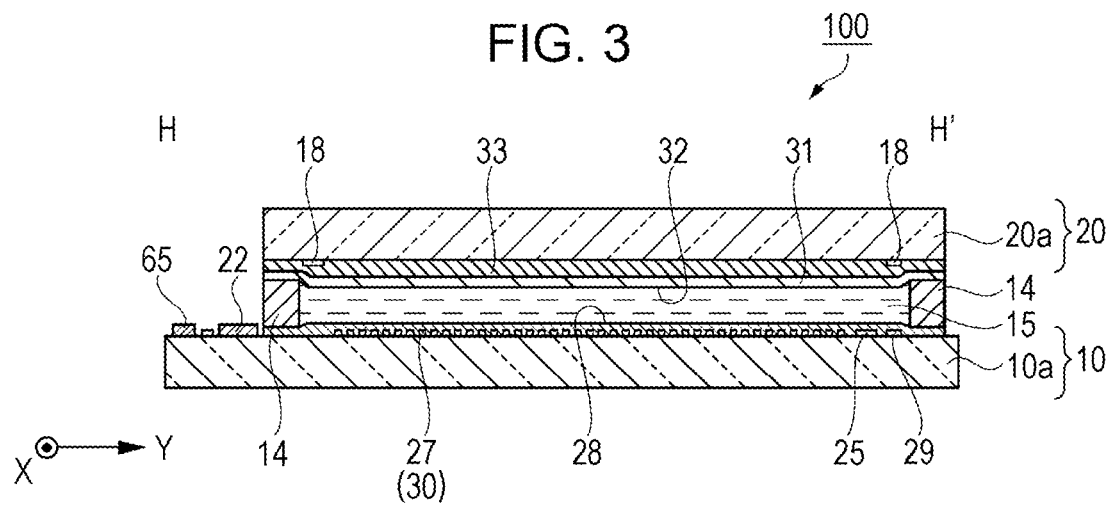
FIG. 3 is a schematic cross-sectional view taken along line H-H' of the liquid crystal device illustrated in FIG. 2.
Figure 4:
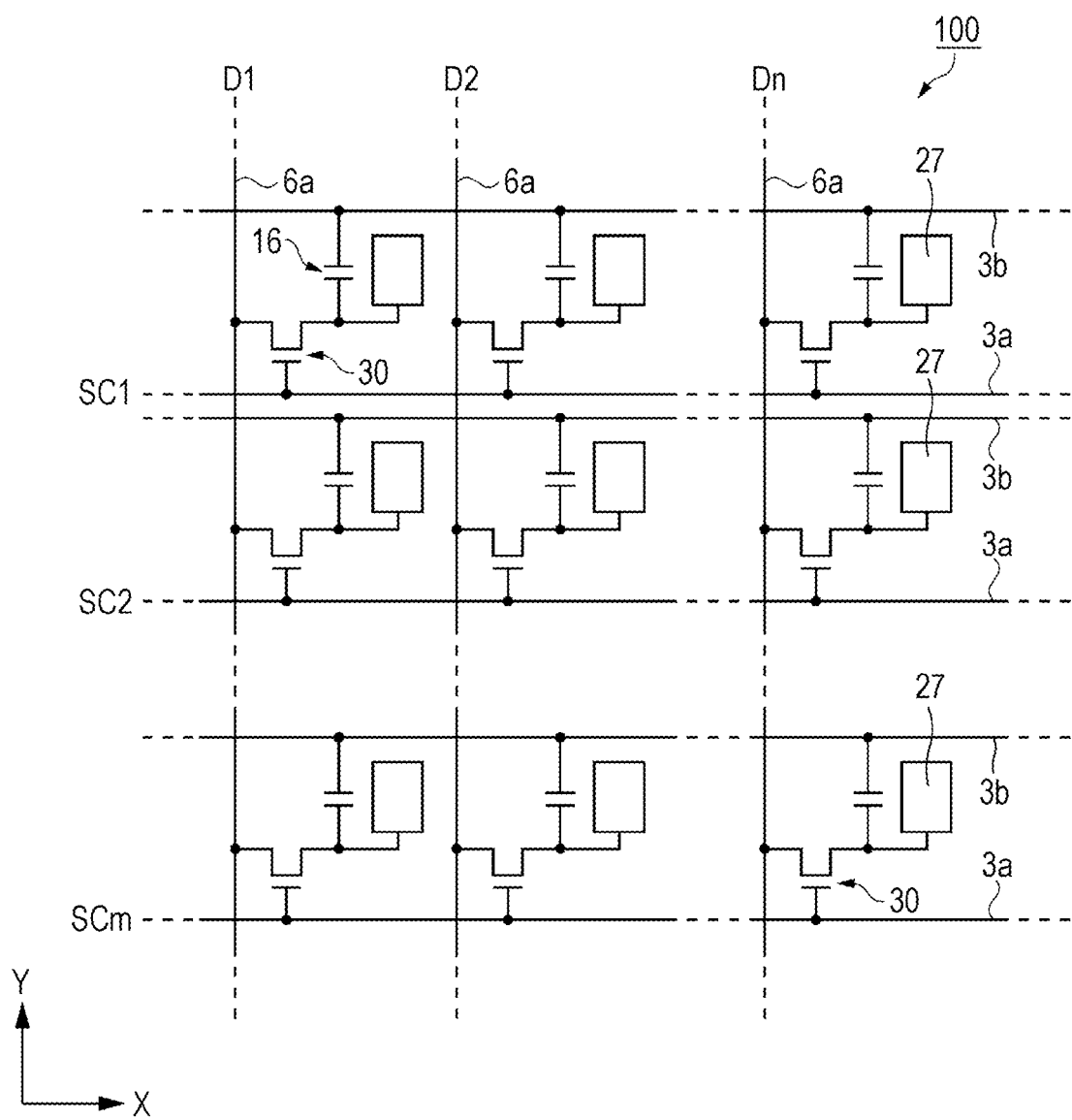
FIG. 4 is an equivalent circuit diagram illustrating an electrical configuration of the liquid crystal device.

FIG. 1 is a schematic plan view illustrating a configuration of a part of a wafer in which a plurality of liquid crystal devices as electrooptical devices are attached to the surface thereof. FIG. 2 is a schematic plan view illustrating a configuration of each of the liquid crystal devices. FIG. 3 is a schematic cross-sectional view taken along line H-H' of the liquid crystal device illustrated in FIG. 2. FIG. 4 is an equivalent circuit diagram illustrating an electrical configuration of the liquid crystal device. Hereinafter, a configuration of the liquid crystal device will be described with reference to FIG. 1 to FIG. 4.

As illustrated in FIG. 1, for example, one substrate (for example, an element substrate) of a pair of substrates which constitute a liquid crystal device 100 is attached to the surface of a wafer 500 in a matrix shape corresponding to a plurality of the liquid crystal devices 100. For example, a size of the wafer 500 is 8 inches. For example, the thickness of the wafer 500 is 1.2 mm. For example, a material of the wafer 500 is quartz. Hereinafter, a configuration of the liquid crystal device 100 will be described.

As illustrated in FIGS. 2 and 3, the liquid crystal device 100 of this embodiment includes an element substrate 10 and a counter substrate 20 which are disposed to face each other, and a liquid crystal layer 15 that is interposed between a pair of the substrates. For example, as a first base material 10a that constitutes the element substrate 10, and a second base material 20a that constitutes the counter substrate 20, a transparent substrate such as a glass substrate and a quartz substrate is used.

The element substrate 10 is larger than the counter substrate 20, and both of the substrates are bonded to each other through a sealing material 14 that is disposed along the outer periphery of the counter substrate 20. Liquid crystal having positive or negative dielectric anisotropy is enclosed between the element substrate 10 and the counter substrate 20 on an inner side of the sealing material 14 that is provided in an annular shape in a plan view, and thus a liquid crystal layer 15 is constituted. As the sealing material 14, for example, an adhesive such as a thermosetting or ultraviolet curable epoxy resin is employed. A spacer (not illustrated) that retains a gap between the pair of substrates is mixed into the sealing material 14.

A display region E in which a plurality of pixels P are arranged is provided on an inner side of the sealing material 14. Although not illustrated in FIGS. 2 and 3, a light shielding film (black matrix BM) that partitions the plurality of pixels P on a plane in the display region E is provided to the counter substrate 20.

A data line drive circuit 22 is provided between the sealing material 14 along one side portion of the element substrate 10 and the one side portion. In addition, an inspection circuit 25 is provided between the sealing material 14 along a different one side portion that faces the one side portion and the display region E. In addition, a scanning line drive circuit 24 is provided between the sealing material 14 along different two side portions, which are perpendicular to the one side portion and face each other, and the display region E. A plurality of interconnections 29, which connect two scanning line drive circuits 24, are provided between the sealing material 14 along the different one side portion that faces the one side portion, and the inspection circuit 25.

In the counter substrate 20, a light shielding film 18 (a bordering portion) is provided between the sealing material 14 that is disposed in an annular shape and the display region E. For example, the light shielding film 18 is formed from a light shielding metal or metal oxide, and the like, and an inner side of the light shielding film 18 becomes the display region E in which the plurality of pixels P are provided. In addition, although not illustrated in FIG. 2, a light shielding film, which partitions the plurality of pixels P on a plane, is also provided in the display region E.

The interconnections, which are connected to the data line drive circuit 22 and the scanning line drive circuit 24, are connected to a plurality of external connection terminals 65 which are arranged along the one side portion. Hereinafter, description will be made on the assumption that a direction along the one side portion is set as an X direction, and a direction along the different two side portions, which are perpendicular to the one side portion and face each other, is set as a Y direction.

As illustrated in FIG. 3, a light-transmitting pixel electrode 27 and a thin film transistor (TFT, hereinafter referred to as a "TFT 30") as a switching element which are provided for each pixel P, a signal interconnection, and an alignment film 28 that covers these components are formed on a surface of the first base material 10a on a liquid crystal layer 15 side.

In addition, a light shielding structure, which prevents instability during a switching operation due to light incident to a semiconductor layer in the TFT 30, is employed. The element substrate 10 in the invention includes at least the pixel electrodes 27, the TFTs 30, and the alignment film 28.

The light shielding film 18, a planarization layer 33 that is formed to cover the light shielding film 18, a counter electrode 31 that is provided to cover the planarization layer 33, and an alignment film 32 that covers the counter electrode 31 are provided on a surface of the counter substrate 20 on a liquid crystal layer 15 side. The counter substrate 20 in the invention includes at least the counter electrode 31 and the alignment film 32.

As illustrated in FIG. 2, the light shielding film 18 is provided at a position which surrounds the display region E and overlaps the scanning line drive circuit 24 and the inspection circuit 25 on a plane. According to this, the light shielding film 18 has a function of shielding light that is incident to peripheral circuits including the drive circuits from a counter substrate 20 side so as to prevent malfunction of the peripheral circuits due to the light. In addition, the light shielding film 18 shields unnecessary stray light so as not to be incident to the display region E, thereby securing high contrast during display of the display region E.

For example, the planarization layer 33 is formed from an inorganic material such as a silicon oxide, has a light-transmitting property, and is provided to cover the light shielding film 18. Examples of a method of forming the planarization layer 33 include a method of forming a film by using a plasma CVD (chemical vapor deposition) method and the like.

For example, the counter electrode 31 is formed from a transparent conductive film such as indium tin oxide (ITO). The counter electrode 31 covers the planarization layer 33 and is electrically connected to an interconnection on an element substrate 10 side by a vertical conduction portion 26 as an electrical conduction portion that is provided at four corners of the counter substrate 20 as illustrated in FIG. 2.

The alignment film 28 that covers the pixel electrode 27, and the alignment film 32 that covers the counter electrode 31 are selected on the basis of the optical design of the liquid crystal device 100. For example, an inorganic alignment film, which is obtained by forming a film of an inorganic material such as SiOx (silicon oxide) by using a vapor phase deposition method and which is approximately vertically aligned with respect to liquid crystal molecules having negative dielectric anisotropy, may be exemplified.

The liquid crystal device 100 is a transmission type, and optical design of a normally white mode or a normally black mode is employed. In the normally white mode, the transmittance of the pixel P during non-application of a voltage is larger than the transmittance during application of a voltage, and thus bright display is realized. In the normally black mode, the transmittance of the pixel P during non-application of a voltage is smaller than the transmittance during application of a voltage, and thus dark display is realized. A polarization element is disposed on a light incidence side and a light emission side, respectively, in accordance with the optical design, and is used.

As illustrated in FIG. 4, the liquid crystal device 100 includes at least a plurality of scanning lines 3a and a plurality of data lines 6a which are insulated from each other at least in the display region E and are perpendicular to each other, and capacitor lines 3b. A direction in which the scanning lines 3a extend is an X direction, and a direction in which the data lines 6a extend is a Y direction.

Each of the scanning lines 3a, each of the data lines 6a, each of the capacitor lines 3b, each of the pixel electrodes 27, each of the TFTs 30, and a capacitive element 16 as a capacitor are provided, and these constitute a pixel circuit of the pixel P.

The scanning line 3a is electrically connected to a gate of the TFT 30, and the data line 6a is electrically connected to a source-drain region (source region) on a data line side of the TFT 30. The pixel electrode 27 is electrically connected to a source-drain region (drain region) on a pixel electrode side of the TFT 30.

Each of the data lines 6a is connected to the data line drive circuit 22 (refer to FIG. 2), and supplies each of the image signals D1, D2, . . . , Dn, which are supplied from the data line drive circuit 22, to the pixel P. Each of the scanning line 3a is connected to the scanning line drive circuit 24 (refer to FIG. 2), and supplies each of the scanning signals SC1, SC2, . . . , SCm, which are supplied from the scanning line drive circuit 24, to the pixel P.

The image signals D1 to Dn which are supplied to the data line 6a from the data line drive circuit 22 may be sequentially supplied in this order, or may be supplied to a plurality of the data lines 6a adjacent to each other for each group. The scanning line drive circuit 24 supplies the scanning signals SC1 to SCm to the scanning lines 3a at a predetermined timing.

The liquid crystal device 100 has the following configuration. That is, when the TFT 30 as a switching element is turned on for only a predetermined period due to an input of each of the scanning signals SC1 to SCm, each of the image signals D1 to Dn which are supplied from the data lines 6a is input to the pixel electrode 27 at a predetermined timing. In addition, each of the image signals D1 to Dn, which are input to the liquid crystal layer 15 through the pixel electrode 27 and are at a predetermined level, is retained for a constant period between each of the pixel electrodes 27 and each of the counter electrode 31 which are disposed to face each other through the liquid crystal layer 15.

So as to prevent the retained image signals D1 to Dn from being leaked, the capacitive element 16 is connected in parallel with a liquid crystal capacitor that is formed between the pixel electrode 27 and the counter electrode 31. The capacitive element 16 is provided a source-drain region on a pixel electrode side of the TFT 30, and the capacitive line 3b. The capacitive element 16 includes a dielectric layer between two capacitive electrodes.

Figure 5:
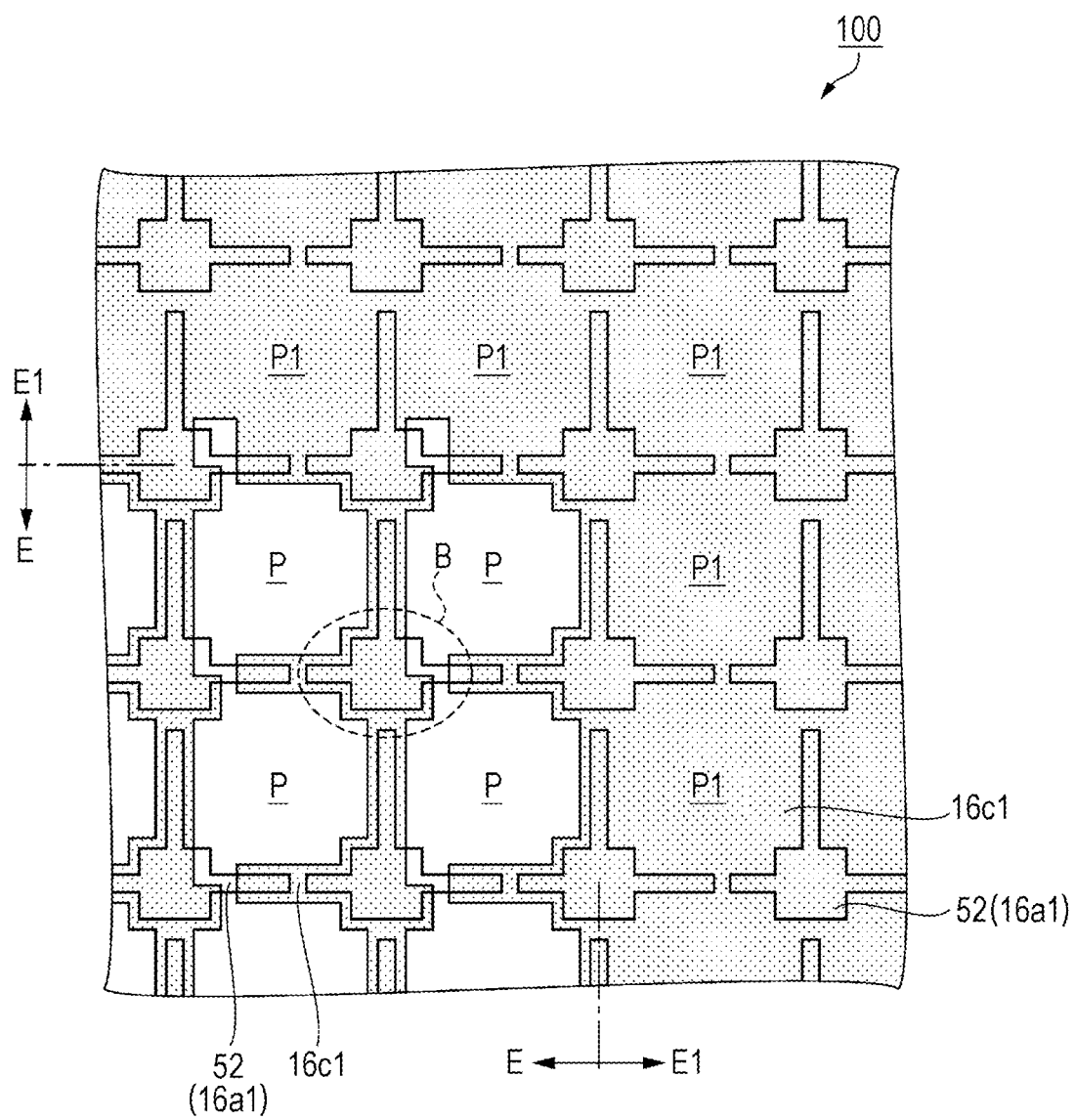
FIG. 5 is an enlarged plan view illustrating a portion A of the wafer illustrated in FIG. 1.
Figure 6:
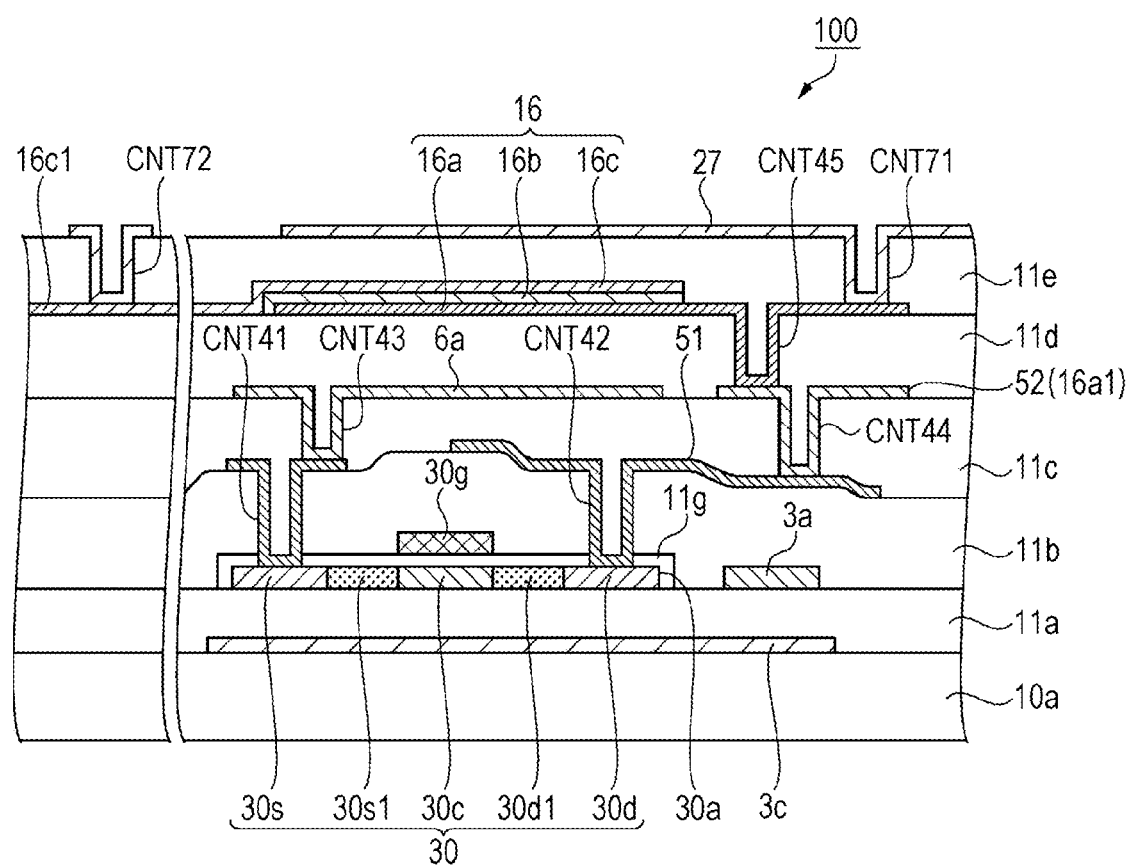
FIG. 6 is a schematic cross-sectional view illustrating a structure of a portion B of the liquid crystal device illustrated in FIG. 5.

FIG. 5 is an enlarged plan view illustrating a portion A of the wafer illustrated in FIG. 1. FIG. 6 is a schematic cross-sectional view illustrating a portion B of the liquid crystal device illustrated in FIG. 5. Hereinafter, a configuration of the liquid crystal device will be described with reference to FIGS. 5 and 6. In addition, FIG. 6 illustrates a cross-sectional positional relationship of respective constituent elements in recognizable scales.

The liquid crystal device 100 illustrated in FIG. 5 is illustrated in a schematic plan view illustrating the periphery of a boundary between a display region E and a dummy pixel region El of the liquid crystal device 100. In the pixel P that is disposed in the display region E, the first interconnection 16a1 that is connected to the drain region of the TFT 30 and the second interconnection 16c1 that is connected to the COM potential are arranged to surround the pixel P.

In the display region E, an area of the first interconnection 16a1 that is electrically connected to the drain region and an area of the second interconnection 16c1 that is electrically connected to the COM potential are approximately the same as each other in terms of a pixel unit. However, connection of the second interconnection 16c1 is performed in a vertical or horizontal manner, or in a matrix shape in a display area, and the second interconnection 16c1 may also be disposed in the dummy pixel region El and a Dr region in the vicinity thereof over a wide area, and thus the area of the second interconnection 16c1 that is electrically connected to the COM potential dramatically increases in comparison to the area of the first interconnection 16a1 that is electrically connected to the drain region.

As described above, in the liquid crystal device 100, it can be seen that the area of the second interconnection 16c1 that is connected to the COM potential becomes wider than the area of the first interconnection 16a1 that is electrically connected to the drain region. Accordingly, static electricity that is accumulated during manufacturing of the liquid crystal device 100 is accumulated in the second interconnection 16c1 on a COM potential side (parasitic capacitance becomes large). Hereinafter, a cross-sectional structure of the liquid crystal device 100 will be described.

As illustrated in FIG. 6, a lower light shielding film 3c formed from titanium (Ti), chromium (Cr), or the like is formed on the first base material 10a. The lower light shielding film 3c is patterned in a planar lattice shape, and defines an opening region of each pixel. In addition, the lower light shielding film 3c may be allowed to function as a part of the scanning line 3a. A base insulating layer 11a formed from a silicon oxide film or the like is formed on the first base material 10a and the lower light shielding film 3c.

The TFT 30, the scanning line 3a, and the like are formed on the base insulating layer 11a. For example, the TFT 30 has a lightly doped drain (LDD) structure, and includes a semiconductor layer 30a formed from polysilicon or the like, a gate insulating film 11g that is formed on the semiconductor layer 30a, and a gate electrode 30g which is formed on the gate insulating film 11g and is formed from a polysilicon film or the like. As described above, the scanning line 3a also functions as the gate electrode 30g.

For example, N-type impurity ions such as phosphorous (P) ions are implanted into the semiconductor layer 30a, and thus the semiconductor layer 30a is formed as an N-type TFT 30. Specifically, the semiconductor layer 30a includes a channel region 30c, an LDD region 30s1 on a data line side, a source-drain region 30s on a data line side, an LDD region 30d1 on a pixel electrode side, and a source-drain region 30d on a pixel electrode side.

The channel region 30c is doped with P-type impurity ions such as boron (B) ions. The other regions (30s1, 30s, 30d1, and 30d) are doped with N-type impurity ions such as phosphorous (P) ions. In this manner, the TFT 30 is formed as an N-type TFT.

A first interlayer insulating layer 11b formed from a silicon oxide film or the like is formed on the gate electrode 30g, the base insulating layer 11a, and the scanning line 3a. Two contact holes CNT41 and CNT42 are provided in the first interlayer insulating layer 11b at a position that overlaps an end of the semiconductor layer 30a in a plan view.

Specifically, a conductive film is formed by using a light-shielding conductive portion material such as aluminum (Al) to bury the contact hole CNT41 and the contact hole CNT42 and to cover the first interlayer insulating layer 11b, and the conductive film is patterned. According to this, a relay interconnection 51, which is connected to the source-drain region 30d on a pixel electrode side through the contact hole CNT42, is formed.

The relay interconnection 51 shields the TFT 30 in combination with the data line 6a to be described later. In addition, the relay interconnection 51 electrically connects parts of the TFT 30 and the pixel electrode 27.

A second interlayer insulating layer 11c is provided on the relay interconnection 51 to cover the relay interconnection 51 and the first interlayer insulating layer 11b. In the second interlayer insulating layer 11c, a contact hole CNT43 is provided so as to overlap a part of the contact hole CNT41 in a plan view, and a contact hole CNT44 is provided so as to overlap a part of the relay interconnection 51 in a plan view.

Specifically, a conductive film is formed by using a light-shielding conductive portion material such as aluminum (Al) to bury the contact holes CNT43 and CNT44 and to cover the second interlayer insulating layer 11c, and the conductive film is patterned to form the data line 6a and the relay interconnection 52.

The data line 6a is electrically connected to the source-drain region 30s (source region) on a data line side of the semiconductor layer 30a through the contact holes CNT43 and CNT41 which are opened in the second interlayer insulating layer 11c and the first interlayer insulating layer 11b. In addition, the relay interconnection 51 on the CNT41 side may be set as a data line without forming the CNT43 in a pixel structure in a display area, and the data line 6a may be set as a shield layer having a fixed potential. In this case, the CNT44 may also not be formed in the pixel, and the relay interconnection 51 and a first capacitive electrode 16a to be described later may be connected by using a CNT45.

A third interlayer insulating layer 11d is provided on the data line 6a and the relay interconnection 52 to cover the data line 6a, the relay interconnection 52, and the second interlayer insulating layer 11c. For example, the third interlayer insulating layer 11d is formed from a silicon oxide or a silicon nitride, and may be subjected to a planarization treatment for planarizing surface unevenness which occurs when covering the TFT 30 and the like. Examples of a method for the planarization treatment include chemical mechanical polishing treatment (CMP treatment), spin coating treatment, and the like.

The first capacitive electrode 16a, which constitutes the capacitive element 16, is patterned and is provided on the third interlayer insulating layer 11d. A dielectric film 16b, which constitutes the capacitive element 16, is patterned and is laminated on the first capacitive electrode 16a.

As the dielectric film 16b, silicon compounds such as a silicon oxide film and a silicon nitride film may be used. In addition to these, dielectric layers having a high dielectric constant such as an aluminum oxide film, a titanium oxide film, a tantalum oxide film, a niobium oxide film, a hafnium oxide film, a lanthanum oxide film, and a zirconium oxide film may be used.

A second capacitive electrode 16c, which constitutes the capacitive element 16, is patterned and is laminated on an upper layer of the dielectric film 16b. The second capacitive electrode 16c is disposed to overlap the first capacitive electrode 16a through the dielectric film 16b, and constitutes the capacitive element 16 in combination with the first capacitive electrode 16a and the dielectric film 16b.

Specifically, a part of the first capacitive electrode 16a as a capacitive electrode on a pixel potential side which is electrically connected to the source-drain region 30d (drain region) on a pixel electrode side of the TFT 30, and the pixel electrode 27, and a part of the second capacitive electrode 16c as a capacitive electrode on a fixed potential side are disposed to face each other through the dielectric film 16b. According to this, the capacitive element 16 is formed.

The second capacitive electrode 16c is connected to a common potential that is a fixed potential. Accordingly, as described above, the second capacitive electrode 16c is in a state in which an area of an interconnection is wide, and thus static electricity is easily accumulated.

In addition, for example, the first capacitive electrode 16a and the second capacitive electrode 16c may be constituted by a metal elementary substance, an alloy, metal silicide, and polysilicide which include at least one among high-melting-point metals such as titanium (Ti), chromium (Cr), tungsten (W), tantalum (Ta), and molybdenum (Mo), a laminated body of these materials, and the like. In addition, the first capacitive electrode 16a and the second capacitive electrode 16c may be formed from an aluminum (Al) film, or may be formed by using ITO and the like.

In addition, an end of the first capacitive electrode 16a overlaps a part of the relay interconnection 52 (16a1) in a plan view, and is electrically connected to an extension portion of the relay interconnection 52 through the contact hole CNT45 that is provided in the third interlayer insulating layer 11d.

A pixel insulating layer 11e as a pixel insulating film is formed on the second capacitive electrode 16c to cover the second capacitive electrode 16c and the third interlayer insulating layer 11d. For example, the pixel insulating layer 11e is formed from a silicon oxide or a silicon nitride, and may be subjected to a planarization treatment for planarizing surface unevenness which occurs when covering an interconnection, an electrode, and the like.

The light-transmitting pixel electrode 27, which is formed from an ITO film and the like, is provided on the pixel insulating layer 11e. The pixel electrode 27 is electrically connected to an extension portion of the first capacitive electrode 16a through a contact hole CNT71 that is provided in the pixel insulating layer 11e and the third interlayer insulating layer 11d.

In this manner, the pixel electrode 27 and the first capacitive electrode 16a are electrically connected to the source-drain region 30d (drain region) on a pixel electrode side of the semiconductor layer 30a through the relay interconnection 52, the contact hole CNT44, the relay interconnection 51, and the contact hole CNT42.

In addition, a contact hole CNT72 for static electricity release is provided in the pixel insulating layer 11e in a region that overlaps a part of the second interconnection 16c1 connected to the second capacitive electrode 16c in a plan view. According to this, static electricity, which is accumulated in the second capacitive electrode 16c that becomes a common potential and the second interconnection 16c1, may be released from the contact hole CNT72 for static electricity release, and thus it is possible to prevent an excessive current from flowing to the capacitive element 16. In addition, the contact hole CNT72 is provided in a region on an outer side of the display region E, and thus does not have an effect on display.

The alignment film 28, which is obtained by oblique deposition of an inorganic material such as silicon oxide ($SiO_2$), is provided on the pixel electrode 27 and the pixel insulating layer 11e (refer to FIG. 3). The liquid crystal layer 15, which is obtained by enclosing liquid crystal and the like in a space surrounded by the sealing material 14, is provided on the alignment film 28 (refer to FIG. 3).

<Method of Manufacturing Electrooptical Device>

Figure 7:
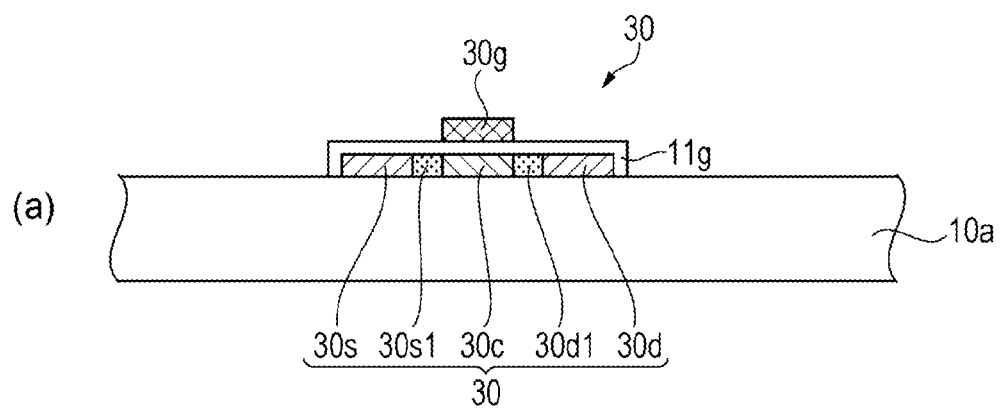
FIG. 7 is a schematic cross-sectional view illustrating a part of methods of manufacturing the liquid crystal device.
Figure 7:
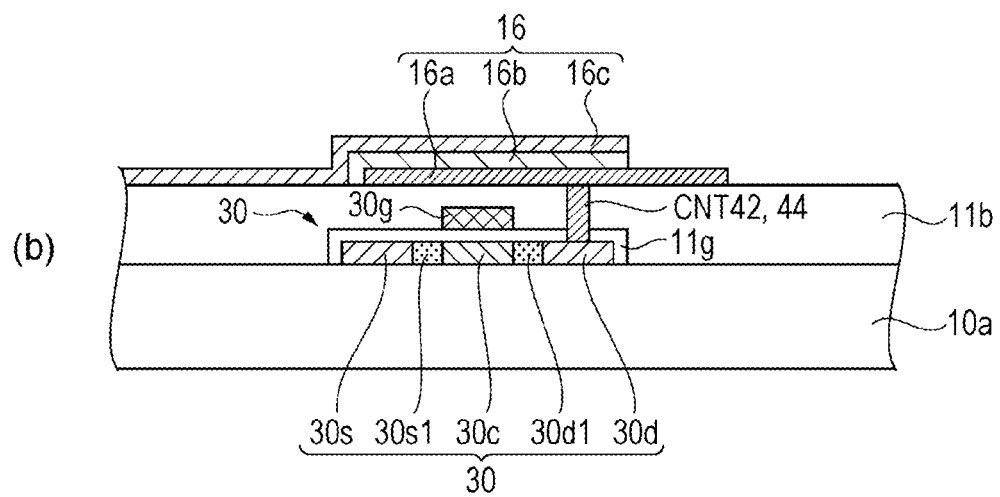
Figure 7:
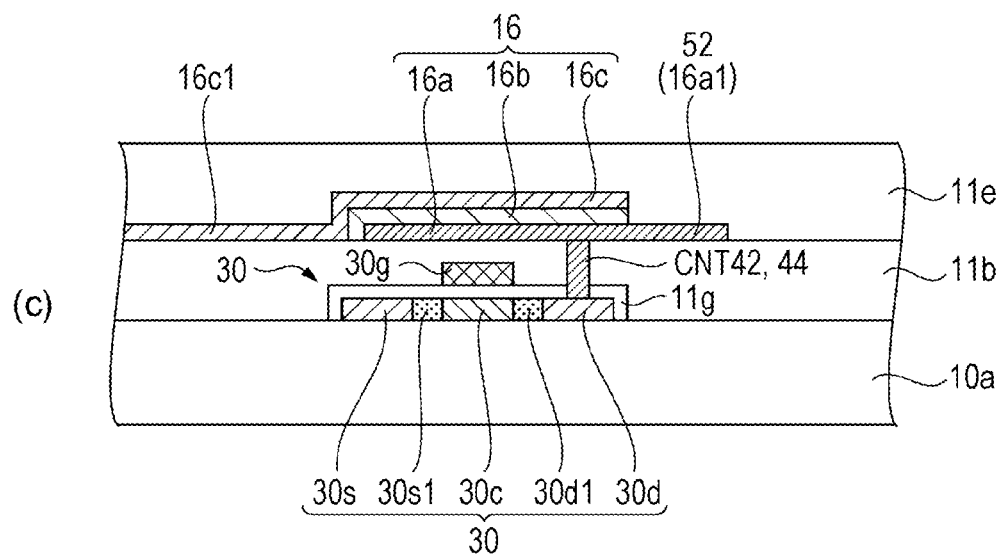
Figure 8:
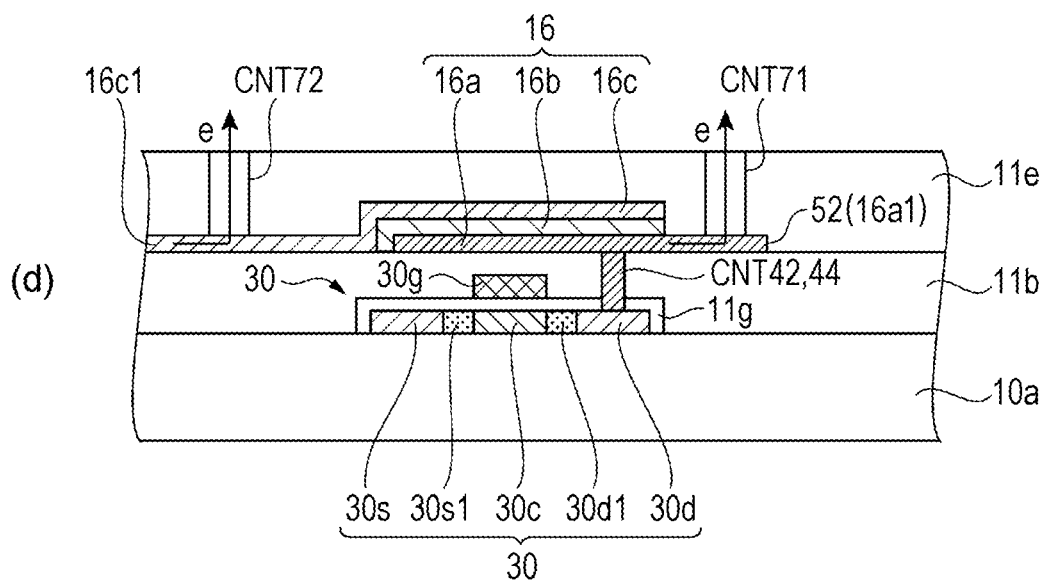
FIG. 8 is a schematic cross-sectional view illustrating a part of methods of manufacturing the liquid crystal device.
Figure 8:
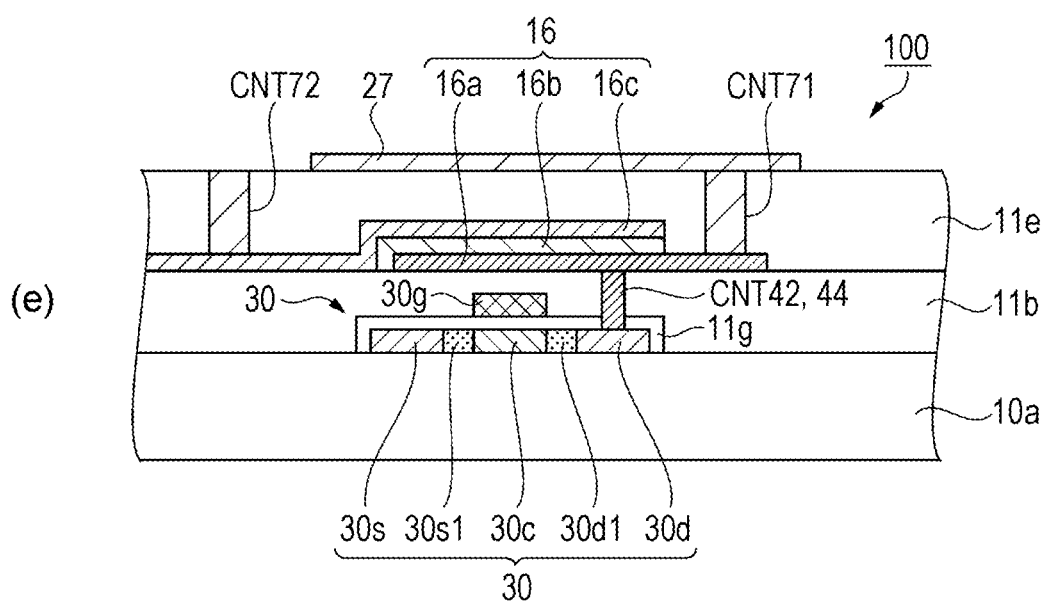

FIGS. 7 and 8 are cross-sectional views illustrating a part of methods of manufacturing a liquid crystal device as an electrooptical device. Hereinafter, the method of manufacturing the liquid crystal device will be described with reference to FIGS. 7 and 8. In addition, FIGS. 7 and 8 illustrate a cross-sectional structure of the liquid crystal device in FIG. 6 in a simplified manner.

First, in a process (a transistor forming process) illustrated in FIG. 7(a), the TFT 30 is formed on the first base material 10a formed from a glass substrate by using a film forming technology, a photography technology, and an etching technology which are known.

In a process (a capacitor forming process, a first interconnection forming process, a second interconnection forming process) illustrated in FIG. 7(b), the capacitive element 16 is formed on the TFT 30. Specifically, first, the first interlayer insulating layer 11b formed from a silicon oxide film or the like is formed on the TFT 30 and the first base material 10a. As a method of manufacturing the first interlayer insulating layer 11b, for example, a chemical vapor deposition (CVD) method is used.

Next, the capacitive element 16 is formed on the first interlayer insulating layer 11b. Specifically, first, a planarization treatment such as a CMP treatment is performed to planarize surface unevenness of the first interlayer insulating layer 11b (the third interlayer insulating layer 11d). Next, the contact holes CNT42 and CNT44 are formed in the first interlayer insulating layer 11b through etching. Then, the capacitive element 16 (the first capacitive electrode 16a, the dielectric film 16b, and the second capacitive electrode 16c) is formed on the first interlayer insulating layer 11b by using a film forming technology, a photolithography technology, and an etching technology which are known.

In addition, for convenience of explanation, the first capacitive electrode 16a and the relay interconnection 52 (16a1) are illustrated as one interconnection. The first capacitive electrode 16a is electrically connected to a drain region 30d side of the TFT 30 and the first interconnection 16a1. In addition, the second capacitive electrode 16c is electrically connected to the second interconnection 16c1 to which a common potential is applied.

In a process (a pixel insulating film forming process) illustrated in FIG. 7(c), the pixel insulating layer 11e is formed to cover the capacitive element 16. Specifically, for example, a film is formed by using a CVD method. Then, a planarization treatment such as a CMP treatment is performed to planarize surface unevenness of the pixel insulating layer 11e.

In a process (a contact hole forming process) illustrated in FIG. 8(d), the contact holes CNT71 and CNT72 are formed in the pixel insulating layer 11e. Specifically, in the pixel insulating layer 11e, the contact hole CNT71 as a first contact hole is formed at a position that overlaps the relay interconnection 52 in a plan view, and the contact hole CNT72 as a second contact hole is formed at a position that overlaps the second interconnection 16c1 in a plan view.

As described above, when opening the contact hole CNT71 that is connected to the first capacitive electrode 16a (16a1), the contact hole CNT72 that is connected to the second capacitive electrode 16c (16c1) is opened in the same pixel insulating layer 11e, and thus it is possible to release static electricity collected on a first capacitive electrode 16a side (on a pixel-potential side capacitive electrode side) from the contact hole CNT71, and it is possible to release excessive static electricity collected on a second capacitive electrode 16c side (a fixed-potential side capacitive electrode side) that is connected to a common potential through the contact hole CNT72. That is, excessive static electricity does not flow to the dielectric film 16b, and thus it is possible to prevent the capacitive element 16 from being broken.

In a process illustrated in FIG. 8(e), the pixel electrode 27 is formed. Specifically, the pixel electrode 27 formed from an ITO film or the like is formed by using a film forming technology, a photography technology, and an etching technology which are known. According to this, the pixel electrode 27 and the contact hole CNT71 are electrically connected to each other. In other words, the pixel electrode 27 and the drain region 30d of the TFT 30 are electrically connected to each other.

In addition, the contact hole CNT72 may be buried with the ITO film, or may be in an opened state without being buried. Then, an inorganic material is obliquely-deposited on the pixel electrode 27 and the pixel insulating layer 11e, thereby forming the alignment film 28.

<Configuration of Electronic Apparatus>

Figure 9:
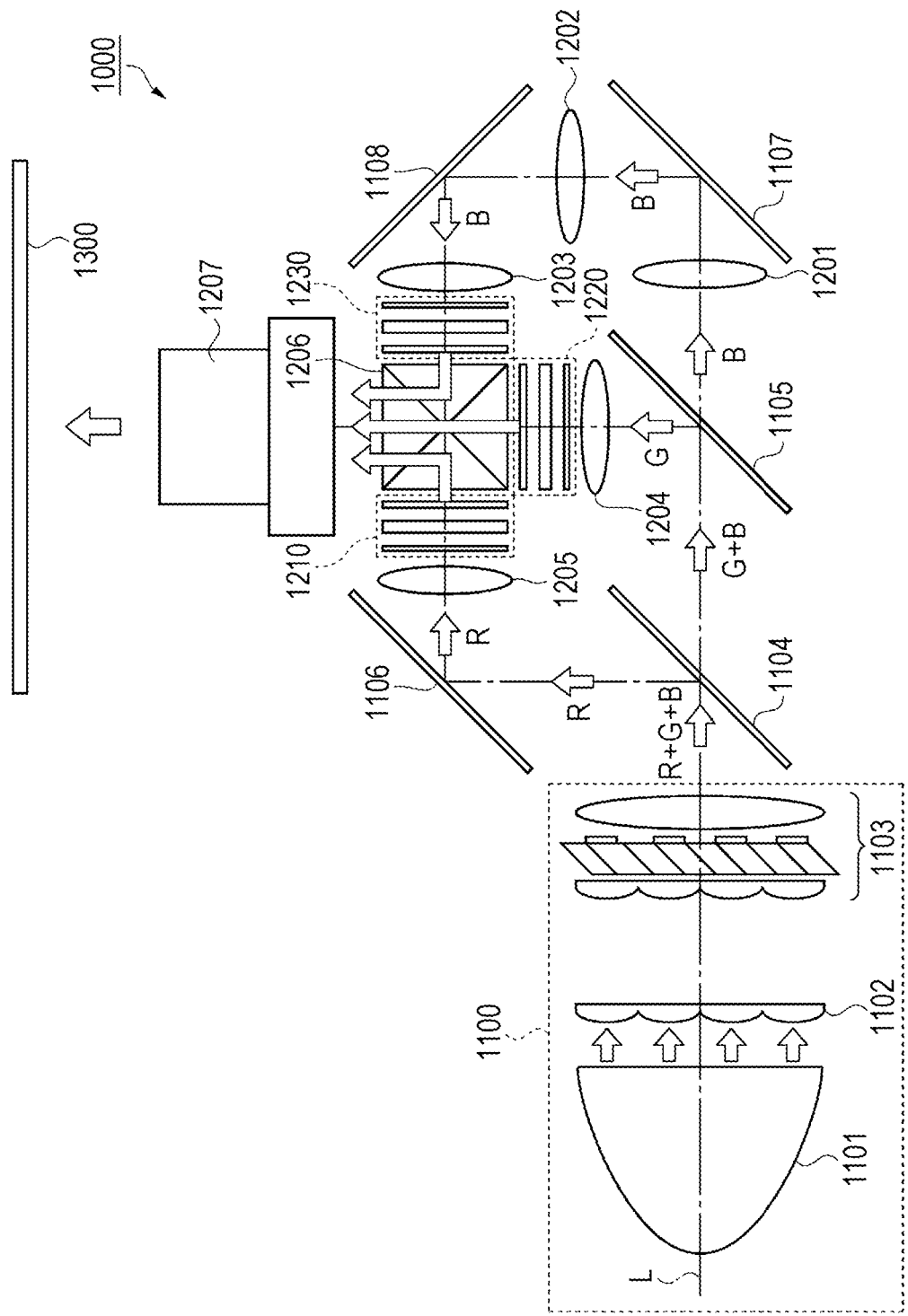
FIG. 9 is a schematic view illustrating a configuration of a projection type display apparatus provided with the liquid crystal device.

Next, a projection type display apparatus as the electronic apparatus of this embodiment will be described with reference to FIG. 9. FIG. 9 is a schematic view illustrating a configuration of a projection type display apparatus provided with the liquid crystal device.

As illustrated in FIG. 9, a projection type display apparatus 1000 of this embodiment includes a polarization lighting apparatus 1100 that is disposed along a system optical axis L, two dichroic mirrors 1104 and 1105 as a light separating element, three reflective mirrors 1106, 1107, and 1108, five relay lenses 1201, 1202, 1203, 1204, and 1205, three transmission type liquid crystal light valves 1210, 1220, and 1230 as a light modulating unit, a cross dichroic prism 1206 as a photosynthesis element, and a projection lens 1207.

The polarization lighting apparatus 1100 includes a lamp unit 1101 as a light source of a white light source such as an ultrahigh pressure mercury lamp and a halogen lamp, an integrator lens 1102, and a polarization conversion element 1103 as a schematic configuration.

The dichroic mirror 1104 reflects a red light beam (R) in a polarized luminous flux that is emitted from the polarization lighting apparatus 1100, and transmits a green light beam (G) and a blue light beam (B) of the polarized luminous flux therethrough. In addition, the other dichroic mirror 1105 reflects a green light beam (G) that is transmitted through the dichroic mirror 1104, and transmits a blue light beam (B) therethrough.

The red light beam (R) that is reflected from the dichroic mirror 1104 is reflected from the reflective mirror 1106 and is incident to the liquid crystal light valve 1210 through the relay lens 1205. The green light beam (G) that is reflected from the dichroic mirror 1105 is incident to the liquid crystal light valve 1220 through the relay lens 1204. The blue light beam (B) that is transmitted through the dichroic mirror 1105 is incident to the liquid crystal light valve 1230 through an optical guiding system including the three relay lenses 1201, 1202, and 1203, and two reflective mirrors 1107 and 1108.

The liquid crystal light valves 1210, 1220, and 1230 are disposed to face incident surfaces of the cross dichroic prism 1206 for respective color light beams, respectively. The color light beams, which are incident to the liquid crystal light valves 1210, 1220, and 1230, respectively, are modulated on the basis of video information (video signal) and are emitted toward the cross dichroic prism 1206.

The prism has a configuration in which four right-angle prisms are bonded to each other, and a dielectric multi-layer film that reflects a red light beam and a dielectric multi-layer film that reflects a blue light beam are formed on inner surfaces of the right-angle prisms in a cross-like shape. Three color light beams are synthesized by the dielectric multi-layer films, and thus a light beam exhibiting a color image is synthesized. The synthesized light beam is projected onto a screen 1300 by the projection lens 1207 that is a projection optical system and is displayed thereon in an enlarged manner.

The above-described liquid crystal device 100 is applied to the liquid crystal light value 1210. The liquid crystal device 100 is disposed between a pair of polarization elements, which are arranged in a cross-nicol relationship on an incidence side and on an emission side of a color light beam, with a gap therebetween. This is also true of the other liquid crystal light valves 1220 and 1230.

According to the projection type display apparatus 1000, the liquid crystal device 100 in which burning and the like are suppressed is used as the liquid crystal light valves 1210, 1220, and 1230, and thus it is possible to realize high display quality.

In addition, as the electronic apparatus on which the liquid crystal device 100 is mounted, in addition to the projection type display apparatus 1000, various electronic apparatuses such as a head-up display, a smart phone, an electrical view finder (EVF), a mobile mini projector, a cellular phone, a mobile computer, a digital still camera, a digital video camera, a display, an in-vehicle apparatus, audio equipment, an exposure device, and lighting equipment may be used.

As described above in detail, according to the liquid crystal device 100, the method of manufacturing the liquid crystal device 100, and the electronic apparatus of this embodiment, the following effects are obtained.

(1) According to the liquid crystal device 100 of this embodiment, the contact hole CNT71 for pixel electrode connection which is electrically connected to one electrode of the capacitive element 16, and the contact hole CNT72 for static electricity release which is electrically connected to the other electrode are opened in the same pixel insulating layer 11e. Accordingly, it is possible to release static electricity that is collected on a first interconnection 16a1 side from the contact hole CNT71, and it is possible to release static electricity that is collected on a second interconnection 16c1 side from the contact hole CNT72. In other words, the contact hole CNT72 is provided independently from the contact hole CNT71 to be electrically connected to the pixel electrode 27. Accordingly, for example, it is possible to prevent excessive static electricity accumulated on a common potential side, in which an area of an interconnection is wide, from flowing to the contact hole CNT71 in a concentrated manner. That is, it is possible to prevent the capacitive element 16 from being broken due to the excessive static electricity.

(2) According to the method of manufacturing the liquid crystal device 100 of this embodiment, the contact hole CNT71 for pixel electrode connection which is electrically connected to the drain region 30d that constitutes the capacitive element 16, and the contact hole CNT72 for static electricity release which is electrically connected to the other electrode are opened in the same pixel insulating layer 11e. Accordingly, it is possible to release static electricity that is collected on a first interconnection 16a1 side from the contact hole CNT71, and it is possible to release static electricity that is collected on a second interconnection 16c1 side from the contact hole CNT72. In other words, the contact hole CNT72 is provided independently from the contact hole CNT71 to be electrically connected to the pixel electrode 27. Accordingly, for example, it is possible to prevent excessive static electricity accumulated on a common potential side, in which an area of an interconnection is wide, from flowing to the contact hole CNT71 in a concentrated manner. That is, it is possible to prevent the capacitive element 16 from being broken due to the excessive static electricity.

(3) According to the electronic apparatus of this embodiment, the capacitive element 16 is protected from excessive static electricity during the manufacturing process, and thus the electronic apparatus can be produced with a high yield ratio, and damage to the insulating film during a manufacturing process is reduced, and thus it is possible to provide an electronic apparatus with high reliability.

In addition, an aspect of the invention is not limited to the above-described embodiment, and appropriate modifications can be made in a range not departing from the gist or the scope of the invention which can be read out from the entirety of claims and the specification. The modifications are included in the technical range of the aspect of the invention. In addition, the invention can be carried out in the following aspects.

MODIFICATION EXAMPLE 1

Figure 10:
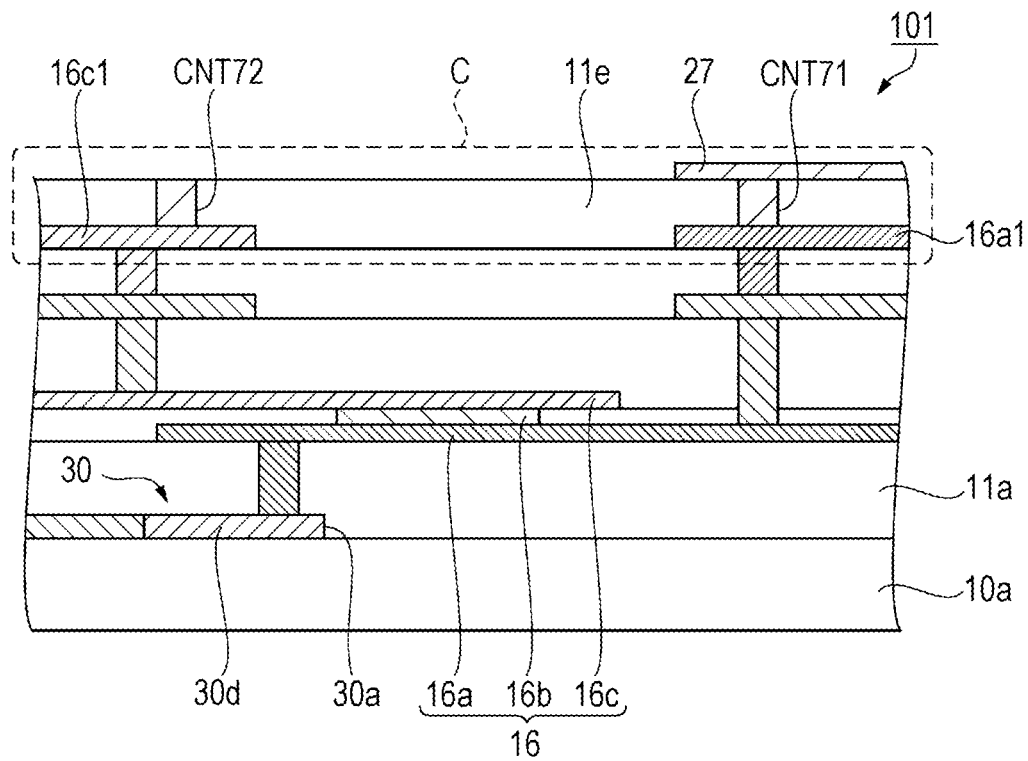
FIG. 10 is a schematic cross-sectional view illustrating a structure of a liquid crystal device of a modification example.
Figure 11:
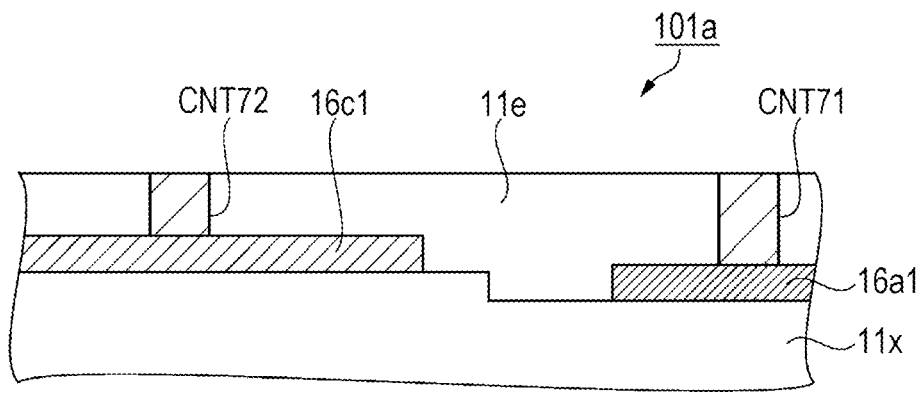
FIG. 11 is a schematic cross-sectional view illustrating only a part of the liquid crystal device in FIG. 10 in an enlarged manner.
Figure 12:
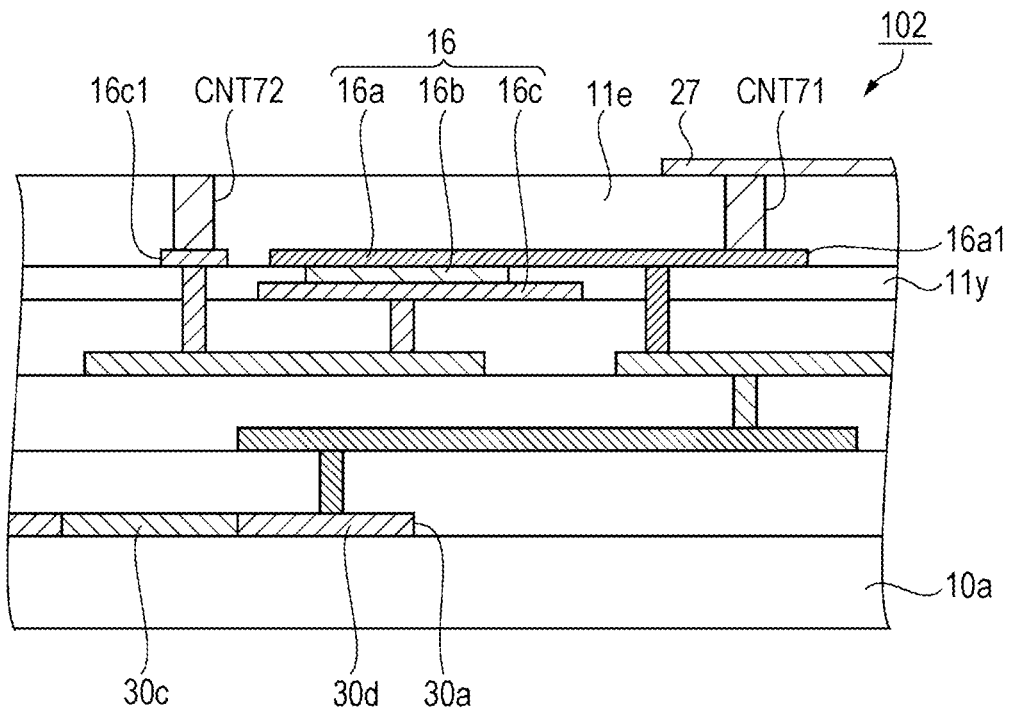
FIG. 12 is a schematic cross-sectional view illustrating a structure of a liquid crystal device of a modification example.
Figure 13:
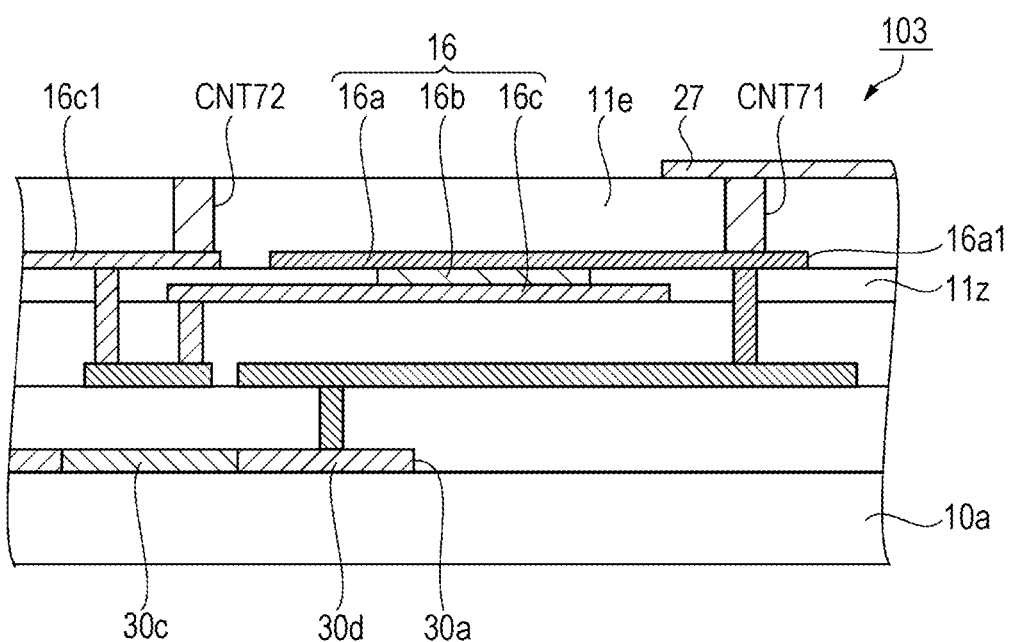
FIG. 13 is a schematic cross-sectional view illustrating a structure of a liquid crystal device of a modification example.

The structure of the liquid crystal device is not limited to the structure illustrated in FIG. 6 as described above, and for example, may be structures illustrated in FIGS. 10 to 13. FIGS. 10, 12, and 13 are schematic cross-sectional views illustrating a structure of a liquid crystal device of this modification example. FIG. 11 is a schematic cross-sectional view illustrating a modification example of a part of the liquid crystal device in FIG. 10.

In a liquid crystal device 101 illustrated in FIG. 10, a semiconductor layer 30a is provided on a first base material 10a, and is electrically connected to a first capacitive electrode 16a that constitutes a capacitive element 16 through a drain region 30d of the semiconductor layer 30a, a contact hole CNT71 for pixel electrode connection and a first interconnection 16a1 which are formed in a pixel insulating layer 11e, and the like. The contact hole CNT71 is electrically connected to the pixel electrode 27.

A second capacitive electrode 16c is formed on the first capacitive electrode 16a through a dielectric film 16b. The second capacitive electrode 16c is electrically connected to a contact hole CNT72 for static electricity release through a second interconnection 16c1 and the like.

As described above, the structure of the capacitive element 16 is different from that in the liquid crystal device 100 illustrated in FIG. 6, but the contact hole CNT71 for pixel electrode connection which is electrically connected to the pixel electrode 27, and the contact hole CNT72 for static electricity release are formed in the same layer, and thus static electricity that is collected on a second interconnection 16c1 side that becomes a common potential during operation can be released from the contact hole CNT72. According to this, it is possible to prevent the capacitive element 16 from being broken due to excessive static electricity.

A liquid crystal device 101a illustrated in FIG. 11 is illustrated by a schematic cross-sectional view that enlarges a portion C of the liquid crystal device 101 illustrated in FIG. 10. In the liquid crystal device 101a illustrated in FIG. 11, a step difference is formed on the surface of an interlayer insulating layer 11x, and thus the height of an upper surface of the second interconnection 16c1 is higher than the height of an upper surface of the first interconnection 16a1. The step difference may be formed by digging into a lower layer of the first interconnection 16a1 through etching, or may be formed by leaving an interconnection pattern in a lower layer of the second interconnection 16c1. In this manner, a pixel insulating layer 11e that is formed on the first interconnection 16a1 and the second interconnection 16c1 is planarized through a CMP treatment, and thus it is possible to adjust the contact hole CNT72 to be thinner than the contact hole CNT71.

According to this configuration, it is possible to open (penetrate) the contact hole CNT72 prior to the contact hole CNT71, and thus even when excessive static electricity is accumulated in the second interconnection 16c1 that becomes a common potential during operation, it is possible to allow the static electricity to quickly flow from the contact hole CNT72 without doing so through the capacitive element 16. That is, it is preferable to open the contact hole CNT72 simultaneously with the contact hole CNT71 or prior to the contact hole CNT71.

In a liquid crystal device 102 that is illustrated in FIG. 12, a semiconductor layer 30a is provided on a first base material 10a, and a capacitive element 16 is provided on an upper side of the semiconductor layer 30a. A second capacitive electrode 16c which constitutes a capacitive element 16 and is connected to a common potential is provided in an interlayer insulating layer 11y. A dielectric film 16b is provided on the second capacitive electrode 16c in the interlayer insulating layer 11y. A first capacitive electrode 16a, which is electrically connected to a drain region 30d, is provided on the interlayer insulating layer 11y in which the dielectric film 16b is provided.

A first interconnection 16a1 that is connected to the first capacitive electrode 16a is electrically connected to a pixel electrode 27, which is provided on a pixel insulating layer 11e, through a contact hole CNT71 for pixel electrode connection. The second capacitive electrode 16c is electrically connected to a second interconnection 16c1, which is provided in the pixel insulating layer 11e, through a relay interconnection in a lower layer, and the like. The second interconnection 16c1 is connected to a contact hole CNT72 for static electricity release which is provided in the pixel insulating layer 11e.

As described above, the structure of the capacitive element 16 is different from that in the liquid crystal device 100 or 101 which is illustrated in FIG. 6 or FIG. 10, but the contact hole CNT71 for pixel electrode connection which is electrically connected to the pixel electrode 27, and the contact hole CNT72 for static electricity release are formed in the same layer, and thus static electricity that is collected on a second interconnection 16c1 side that becomes a common potential during operation can be released from the contact hole CNT72. According to this, it is possible to prevent the capacitive element 16 from being broken due to excessive static electricity.

In a liquid crystal device 103 illustrated in FIG. 13, a semiconductor layer 30a is provided on a first base material 10a, and a capacitive element 16 is provided on an upper side of the semiconductor layer 30a. A second capacitive electrode 16c, which constitutes the capacitive element 16 and is connected to a common potential, is provided in an interlayer insulating layer 11z. A dielectric film 16b is provided on the second capacitive electrode 16c in the interlayer insulating layer 11z. A first capacitive electrode 16a, which is electrically connected to a drain region 30d, is provided on the interlayer insulating layer 11z in which the dielectric film 16b is provided.

A first interconnection 16a1 that is connected to the first capacitive electrode 16a is electrically connected to a pixel electrode 27, which is provided on a pixel insulating layer 11e, through a contact hole CNT71 for pixel electrode connection. The second capacitive electrode 16c is electrically connected to a second interconnection 16c1, which is provided in the pixel insulating layer 11e, through a relay interconnection in a lower layer, and the like. The second interconnection 16c1 is connected to a contact hole CNT72 for static electricity release which is provided in the pixel insulating layer 11e.

As described above, the structure of the capacitive element 16 is different from that in the liquid crystal devices 100, 101, and 102 which are illustrated in FIG. 6, FIG. 10, and FIG. 12, but the contact hole CNT71 for pixel electrode connection which is electrically connected to the pixel electrode 27, and the contact hole CNT72 for static electricity release are formed in the same layer, and thus static electricity that is collected on a second interconnection 16c1 side that becomes a common potential during operation can be released from the contact hole CNT72. According to this, it is possible to prevent the capacitive element 16 from being broken due to excessive static electricity.

MODIFICATION EXAMPLE 2

For example, the invention may be applied to a reflection type liquid crystal device without limitation to the transmission type liquid crystal device 100 as described above.

MODIFICATION EXAMPLE 3

For example, the invention may be applied to an organic EL device, a plasma display, an electronic paper, and the like without limitation to using of the liquid crystal device 100 as an electrooptical device as described above.

This application claims priority to Japan Patent Application No. 2013-009014 filed Jan. 22, 2013, the entire disclosures of which are hereby incorporated by reference in their entireties.

REFERENCE SIGNS LIST

3*a* Scanning line
3*b* Capacitor line
3*c* Lower side light shielding film
6*a* Data line
10 Element substrate
10*a* First base material
11*a* Base insulating layer
11*b* First interlayer insulating layer
11*c* Second interlayer insulating layer
11*d* Third interlayer insulating layer
11*e* Pixel insulating layer as pixel insulating film
11*g* Gate insulating film
11*x*, 11*y*, 11*z* Interlayer insulating layer
14 Sealing material
15 Liquid crystal layer
16 Capacitive element as capacitor
16*a* First capacitive electrode
16*a*1 First interconnection
16*b* Dielectric film
16*c* Second capacitive electrode
16*c*1 Second interconnection
18 Light shielding film
20 Counter substrate
20*a* Second base material
22 Data line drive circuit
24 Scanning line drive circuit
25 Inspection circuit
26 Vertical conduction portion
27 Pixel electrode
28, 32 Alignment film
29 Interconnection
30 TFT
30*a* Semiconductor layer
30*c* Channel region
30*d* Source-drain region (drain region) on pixel electrode side
30*d*1 LDD region on pixel electrode side
30*g* Gate electrode
30*s* Source-drain region (source region) on data line side
30*s*1 LDD region on data line side
31 Counter electrode
33 Planarization layer
CNT41, 42, 43, 44, 45 Contact hole
51, 52 Relay interconnection

65 External connection terminal
CNT71 Contact hole for pixel electrode connection (first contact hole)
CNT72 Contact hole for static electricity release (second contact hole)
100, 101, 101*a*, 102, 1203 Liquid crystal device
500 Wafer
1000 Projection type display apparatus
1100 Polarization lighting apparatus
1101 Lamp unit
1102 Integrator lens
1103 Polarization conversion element
1104, 1105 Dichroic mirror
1106, 1107, 1108 Reflective mirror
1201, 1202, 1203, 1204, 1205 Relay lens
1206 Cross dichroic prism
1207 Projection lens
1210, 1220, 1230 Liquid crystal light valve
1300 Screen

The invention claimed is:

1. An electrooptical device, comprising:
a first base that has a first region;
a transistor that is disposed above the first base;
a pixel that is disposed above the first base in the first region and has a pixel electrode;
a capacitor that is electrically connected to the transistor and has a first electrode and a second electrode, the capacitor having an insulating film that is disposed between the first electrode and the second electrode;
a first interconnection that is electrically connected to the first electrode;
a second interconnection that is electrically connected to the second electrode;
a first contact hole that electrically connects the first interconnection and the pixel electrode;
a second contact hole that is disposed on the second interconnection; and
an external connection terminal configured to supply a potential to the second interconnection,
wherein the first contact hole and the second contact hole are disposed in a pixel insulating film that is disposed on and in contact with the first interconnection and the second interconnection and that is disposed between the pixel electrode, and the first interconnection and the second interconnection, and
at least a portion of the second interconnection is disposed in the first region.

2. The electrooptical device according to claim 1,
wherein a height from an upper surface of the first base to an upper surface of the second interconnection is higher than a height from the upper surface of the first base to an upper surface of the first interconnection.

3. The electrooptical device according to claim 2, wherein the first base has the first region and a second region positioned outside the first region, the second interconnection is disposed in the first region and the second region.

4. The electrooptical device according to claim 1,
wherein a common potential is applied to the second interconnection.

5. The electrooptical device according to claim 1, further comprising:
a second base that faces the first base,
wherein the second contact hole is provided at a position that overlaps the second base-when viewed in a direction from the second base to the first base.

6. An electronic apparatus, comprising: electrooptical device according to claim 1.

7. The electrooptical device according to claim 1, wherein the first base has the first region and a second region positioned outside the first region, the second interconnection is disposed in the first region and the second region.

8. The electrooptical device according to claim 1, further comprising:
a second base that faces the first base; and
a counter electrode that is disposed on the second base, wherein
the pixel electrode faces the counter electrode, and
the external connection terminal is further configured to supply the potential to the counter electrode.

9. The electrooptical device according to claim 1, wherein the potential supplied to the second interconnection and the counter electrode is a common potential.

10. The electrooptical device according to claim 1, wherein
the first base further includes a second region positioned outside the first region, and
the second contact hole is disposed in the second region.

11. An electrooptical device, comprising:
a first base that has a first region;
a transistor that is disposed above the first base;
a pixel that is disposed above the first base in the first region and has a pixel electrode;
a capacitor that is electrically connected to the transistor and has a first electrode and a second electrode, the capacitor having an insulating film that is disposed between the first electrode and the second electrode;
a first interconnection that is electrically connected to the first electrode;
a second interconnection that is electrically connected to the second electrode;
a first contact hole that electrically connects the first interconnection and the pixel electrode;
a second contact hole that is disposed on the second interconnection; and
an external connection terminal configured to supply a potential to the second interconnection,
wherein
the first contact hole and the second contact hole are disposed in a pixel insulating film that is disposed between the pixel electrode, and the first interconnection and the second interconnection,
at least a portion of the second interconnection is disposed in the first region, and the first interconnection and the second interconnection are disposed in a first layer.

12. The electrooptical device according to claim 11, further comprising:
a second base that faces the first base; and
a counter electrode that is disposed on the second base, wherein
the pixel electrode faces the counter electrode, and
the external connection terminal is further configured to supply the potential to the counter electrode.

13. The electrooptical device according to claim 11, wherein
the first base further includes a second region positioned outside the first region, and the second contact hole is disposed in the second region.

* * * * *